(12) United States Patent
Lee et al.

(10) Patent No.: US 12,125,907 B2
(45) Date of Patent: Oct. 22, 2024

(54) SEMICONDUCTOR AND METHOD OF MANUFACTURING THE SAME

(71) Applicant: ELECTRONICS AND TELECOMMUNICATIONS RESEARCH INSTITUTE, Daejeon (KR)

(72) Inventors: Seong Hyun Lee, Daejeon (KR); Dongwoo Suh, Daejeon (KR); Sang Hoon Kim, Daejeon (KR); Jeong Woo Park, Daejeon (KR); Tae Moon Roh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 413 days.

(21) Appl. No.: 17/564,688

(22) Filed: Dec. 29, 2021

(65) Prior Publication Data

US 2022/0359749 A1    Nov. 10, 2022

(30) Foreign Application Priority Data

May 10, 2021   (KR) .................. 10-2021-0060099
Nov. 30, 2021  (KR) .................. 10-2021-0169052

(51) Int. Cl.
*H01L 29/78* (2006.01)
*H01L 27/12* (2006.01)
(Continued)

(52) U.S. Cl.
CPC ...... *H01L 29/7831* (2013.01); *H01L 27/1203* (2013.01); *H01L 29/42312* (2013.01);
(Continued)

(58) Field of Classification Search
CPC ......... H01L 29/42312; H01L 29/42316; H01L 29/4232; H01L 29/7831; H01L 27/1203;
(Continued)

(56) References Cited

U.S. PATENT DOCUMENTS 6,368,925 B2 * 4/2002 Weon ................ H01L 29/66651
257/E21.426
7,709,330 B2 * 5/2010 Cho .................. H01L 29/66659
438/275
(Continued)

FOREIGN PATENT DOCUMENTS

CN        110164958 B      8/2020
ES        2867698 A1  * 10/2021  ............. B82Y 10/00
(Continued)

OTHER PUBLICATIONS

Andreas Fuschsberger et al., "Reconfigurable Field Effect Transistor Technology via Heterogeneous Integration of SiGe with Crystalline Al Contacts" (Year: 2023).*
(Continued)

*Primary Examiner* — Maliheh Malek
(74) *Attorney, Agent, or Firm* — Rabin & Berdo, P.C.

(57) ABSTRACT

Provided is a semiconductor device. The semiconductor device includes a semiconductor substrate including monocrystalline silicon or polycrystalline silicon, a first insulating layer on the semiconductor substrate, the first insulating layer including a local region in which a portion of an upper surface of the first insulating layer is recessed, a channel layer provided in the local region of the first insulating layer, a silicide provided on one side surface of the channel layer, a control gate provided on the channel layer, a gate insulating film provided between the channel layer and the control gate, and a polarity control gate arranged so as to overlap an interface between the channel layer and the silicide, wherein the polarity control gate is spaced apart from the control gate, and the channel layer includes monocrystalline silicon.

9 Claims, 10 Drawing Sheets

(51) Int. Cl.
  *H01L 29/423* (2006.01)
  *H01L 29/45* (2006.01)
  *H01L 29/66* (2006.01)

(52) U.S. Cl.
  CPC .... *H01L 29/42316* (2013.01); *H01L 29/4232* (2013.01); *H01L 29/458* (2013.01); *H01L 29/66484* (2013.01); *H01L 29/66772* (2013.01)

(58) Field of Classification Search
  CPC ............. H01L 29/458; H01L 29/66484; H01L 29/66772; H01L 27/1207; H01L 29/78618; H01L 29/78654; H01L 29/78645
  See application file for complete search history.

(56) References Cited

U.S. PATENT DOCUMENTS

| | | | | |
|---|---|---|---|---|
| 8,180,184 | B2 * | 5/2012 | Park | G02F 1/025 385/2 |
| 9,401,435 | B2 * | 7/2016 | Lee | H01L 29/78391 |
| 11,594,617 | B2 * | 2/2023 | Hekmatshoartabari | H01L 29/66666 |
| 2007/0252209 | A1 * | 11/2007 | Yamazaki | H01L 21/76 257/E27.113 |
| 2008/0203477 | A1 * | 8/2008 | Yamazaki | H01L 27/1233 257/E29.302 |
| 2011/0018608 | A1 * | 1/2011 | Chi | H03K 17/60 257/E29.171 |
| 2014/0362644 | A1 * | 12/2014 | Lue | H01L 29/66484 365/185.23 |
| 2015/0236169 | A1 * | 8/2015 | Park | H01L 29/78693 257/43 |
| 2016/0056301 | A1 * | 2/2016 | Lee | H01L 29/42344 257/295 |
| 2018/0012996 | A1 * | 1/2018 | Baldauf | H01L 29/41741 |
| 2018/0286880 | A1 * | 10/2018 | Sakamoto | H01L 27/0883 |
| 2020/0350213 | A1 * | 11/2020 | Ramkumar | H10B 43/40 |
| 2021/0202752 | A1 * | 7/2021 | Simon | H01L 29/47 |
| 2021/0249539 | A1 * | 8/2021 | Zhu | H01L 29/7831 |
| 2021/0391329 | A1 * | 12/2021 | Jiang | G11C 13/003 |
| 2022/0149184 | A1 * | 5/2022 | Hekmatshoartabari | H01L 29/7845 |

FOREIGN PATENT DOCUMENTS

| | | | | | |
|---|---|---|---|---|---|
| GB | 2518679 | A | * | 4/2015 | ............ B82Y 10/00 |
| JP | 2006303453 | A | | 11/2006 | |
| KR | 100398041 | B1 | | 9/2003 | |
| KR | 101508971 | B1 | | 4/2015 | |
| KR | 101881068 | B1 | | 7/2018 | |
| KR | 101954254 | B1 | | 3/2019 | |
| KR | 102097055 | B1 | | 4/2020 | |
| WO | WO-2021214359 | A1 | * | 10/2021 | ............ B82Y 10/00 |

OTHER PUBLICATIONS

Galderisi et al. "Reconfigurable Field Effect Transistors Design Solutions for Delay-Invariant Logic Gates", IEEE Embedded Systems Letters, vol. 14, No. 2. (Year: 2022).*

Mikolajick et al. "Reconfigurable Field Effect Transistors: A Technology Enablers Perspective". Elsevier, Solid-State Electronics 194 (Year: 2022).*

Seong Hyun Lee et al., "Characterization of Reconfigurable FETs Fabricated on Si Epilayer on SiO2", 44th International Semiconductor Conference CAS 2021, Oct. 7, 2021.

* cited by examiner

SEMICONDUCTOR AND METHOD OF MANUFACTURING THE SAME

CROSS-REFERENCE TO RELATED APPLICATIONS

This U.S. non-provisional patent application claims priority under 35 U.S.C. § 119 of Korean Patent Application Nos. 10-2021-0060099, filed on May 10, 2021, and 10-2021-0169052, filed on Nov. 30, 2021, the entire contents of which are hereby incorporated by reference.

BACKGROUND

The present disclosure herein relates to a field effect transistor (FET) device, and more particularly, to a reconfigurable FET functioning as both N-type and P-type FETs and a method for manufacturing the same.

Recently, as a micro semiconductor process reaches physical limits, it is technically difficult to increase the degree of integration of a semiconductor chip using individual CMOS transistor devices, and, in order to resolve this issue, researches are carried out to develop new semiconductor devices.

To resolve the above issue in a situation in which the level of technology for increasing information processing density of a logical operation unit is not high, researches are carried out to develop a reconfigurable FET technology that makes it possible to operate a single transistor as an N-type or P-type FET according to a circuit-related need.

Most of existing reconfigurable FET devices have been developed using a silicon on insulator (SOI) semiconductor substrate or a one-dimensional structure such as nanowire, but still remain at a design or simulation level since implementation of the devices is difficult. In particular, an SOI semiconductor substrate wafer is more expensive than typical wafers and thus has a disadvantage in terms of economic feasibility, and a nanowire structure has a technical disadvantage since a process of integrating the nanowire structure is complicated. Therefore, existing reconfigurable FETs are not applied to advanced bulk CMOS technology of the present time.

SOI-based reconfigurable FET technology requires a design and process environment different from those of existing CMOS semiconductors, and thus an existing CMOS process cannot be applied to this technology.

SUMMARY

The present disclosure provides a semiconductor device that makes it possible to manufacture a reconfigurable field effect transistor in an arbitrary region on a silicon wafer through an existing CMOS process.

An embodiment of the inventive concept provides semiconductor device including a semiconductor substrate including monocrystalline silicon or polycrystalline silicon, a first insulating layer on the semiconductor substrate, the first insulating layer including a local region in which a portion of an upper surface of the first insulating layer is recessed, a channel layer provided in the local region of the first insulating layer, a silicide provided on one side surface of the channel layer, a control gate provided on the channel layer, a gate insulating film provided between the channel layer and the control gate, and a polarity control gate arranged so as to overlap an interface between the channel layer and the silicide, wherein the polarity control gate is spaced apart from the control gate, and the channel layer includes monocrystalline silicon.

In an embodiment, the first insulating layer may further include a hole, wherein the hole may be arranged spaced apart from the local region.

In an embodiment, the hole may be contiguous to the local region.

In an embodiment, the polarity control gate may be provided in plurality and include a first polarity control gate and a second polarity control gate, wherein the first polarity control gate may overlap a first side surface of the channel layer, and the second polarity control gate may overlap a second side surface of the channel layer.

In an embodiment, the channel layer may be formed through an epitaxial lateral growth process.

In an embodiment, a level of an upper surface of the channel layer may be the same as a level of the upper surface of the first insulating layer outside the local region.

In an embodiment, the first insulating layer may include a silicon nitride film, silicon oxide film, silicon oxynitride film, or metal oxide.

In an embodiment, a width of the control gate may be smaller than a width of the channel layer.

In an embodiment, the silicide may be arranged at an edge of the local region.

In an embodiment of the inventive concept, a semiconductor device includes a semiconductor substrate including monocrystalline silicon or polycrystalline silicon, a first insulating layer on the semiconductor substrate, a polarity control gate provided in the first insulating layer, and a gate insulating pattern, a channel layer, a gate insulating film, and a control gate, which are sequentially laminated on the first insulating layer and the polarity control gate, wherein at least a portion of the polarity control gate vertically overlaps the channel layer, and the channel layer includes monocrystalline silicon.

In an embodiment, the first insulating layer may further include a hole, wherein the hole may be arranged spaced apart from the local region.

In an embodiment, the semiconductor device may further include a silicide arranged on one side surface of the channel layer.

In an embodiment, one side surface of the control gate may be arranged in alignment with an interface between the channel layer and the silicide.

In an embodiment, a width of the control gate may be the same as a width of the channel layer.

In an embodiment, the channel layer may be formed through an epitaxial lateral growth process.

In an embodiment of the inventive concept, a method for manufacturing a semiconductor device includes forming a first insulating layer on a semiconductor substrate, the semiconductor substrate including monocrystalline silicon or polycrystalline silicon, forming a local region and a hole by etching the first insulating layer, wherein a portion of an upper surface of the semiconductor substrate is exposed through the hole, growing an epi layer using the upper surface of the semiconductor substrate exposed through the hole as a seed, the epi layer protruding out of a surface of the first insulating layer, performing an epitaxial lateral growth process on the epi layer along the surface of the first insulating layer, wherein the epi layer is formed in the local region through the epitaxial lateral growth process, forming a channel layer in the local region by performing a planarization process until the surface of the first insulating layer is exposed, forming a gate insulating film on the channel layer, and forming, on the gate insulating film, a control gate and a polarity control gate spaced apart from the control gate.

In an embodiment, the local region may be contiguous to the hole.

In an embodiment, the local region may be arranged spaced apart from the hole.

In an embodiment, the polarity control gate may be formed so as to overlap an interface between the channel layer and a silicide.

In an embodiment, the epi layer may be isotropically formed.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
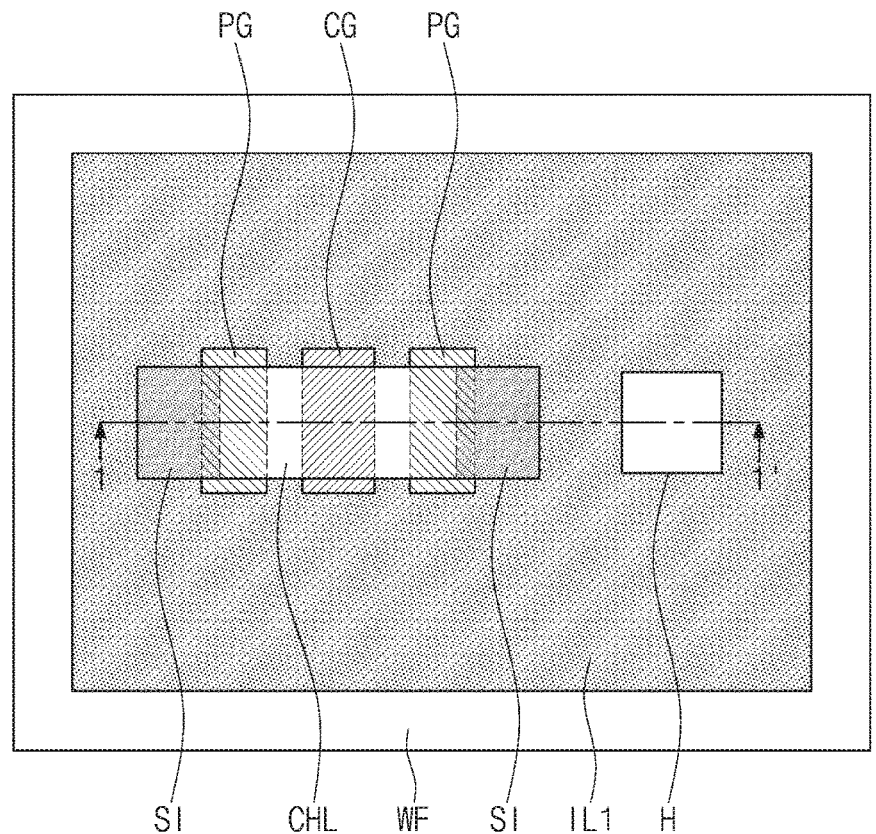
FIG. 1 is a diagram illustrating that a semiconductor device according to an embodiment of the inventive concept is arranged on a semiconductor substrate.

Hereinafter, embodiments of the inventive concept will be described with reference to the accompanying drawings so that the configuration and effects of the inventive concept are sufficiently understood.

The inventive concept is not limited to the embodiments described below, but may be implemented in various forms and may allow various changes and modifications. Rather, the embodiments are provided so that this disclosure will be thorough and complete, and will fully convey the scope of the inventive concept to those skilled in the art. In the accompanying drawings, the dimensions of elements are magnified for convenience, and the scale ratios among the elements may be exaggerated or reduced.

The embodiments of the inventive concept will be described with reference to example cross-sectional view and/or plan views. In the drawings, the dimensions of layers and regions are exaggerated for clarity of illustration. Therefore, the regions illustrated in the drawings are merely schematic, and the shapes of the regions exemplify specific shapes of the elements but do not limit the scope of the invention. Relational terms such as "first", "second", "third", and the like are used in various embodiments of the present invention to describe various elements, but the elements should not be limited by the terms. Such terms are merely used to distinguish one element from another element. The embodiments described herein include complementary embodiments thereof.

Furthermore, when a layer, a film, a region or a plate is referred to as being "on" another part, it can be directly on the other part, or intervening parts may also be present. Likewise, when a part such as a layer, a film, an area, a plate, or the like is referred to as being "under" another part, it can be directly under the other part or intervening parts may be present.

The terminology used herein is not for limiting the invention but for describing particular embodiments. Furthermore, the terms used herein may be interpreted as the meanings known in the art unless the terms are defined differently.

The terms of a singular form may include plural forms unless otherwise specified. It will be further understood that the terms "includes", "including", "comprises", and/or "comprising", when used in this description, specify the presence of stated elements, steps, operations, and/or components, but do not preclude the presence or addition of one or more other elements, steps, operations, and/or components.

Hereinafter, a semiconductor device according to an embodiment of the inventive concept will be described in detail with reference to the drawings.

Figure 2:
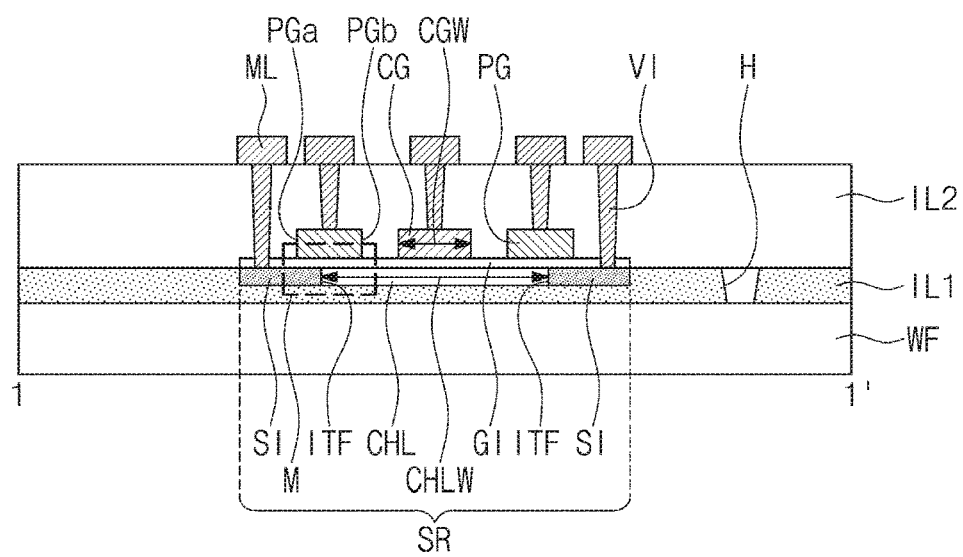
FIG. 2 is a cross-sectional view of a semiconductor device according to an embodiment of the inventive concept.
Figure 3:
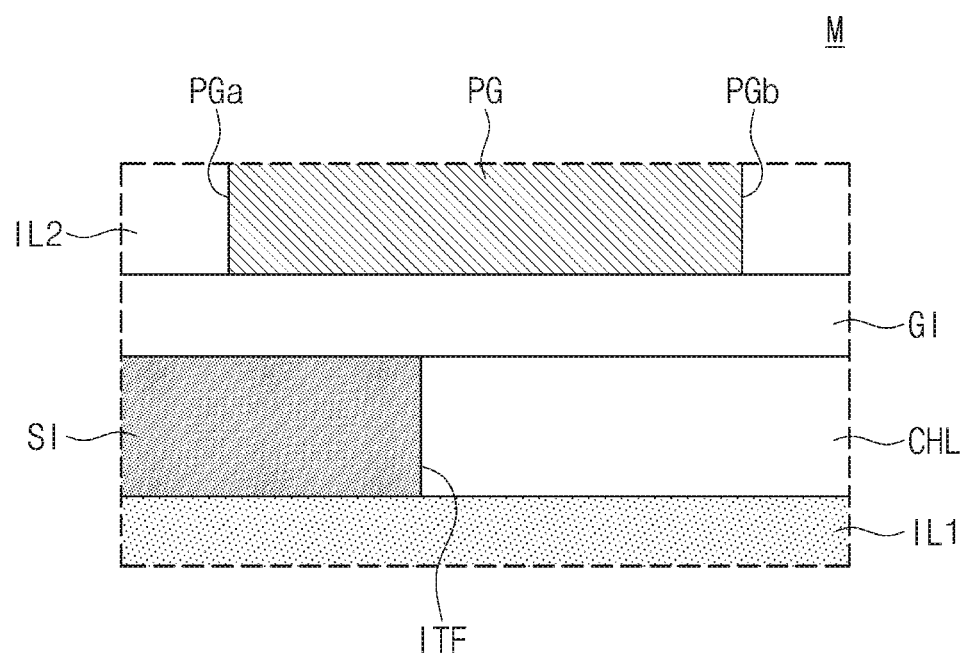
FIG. 3 is an enlarged view of the region M of FIG. 2.

FIG. 1 is a diagram illustrating that a semiconductor device according to an embodiment of the inventive concept is arranged on a semiconductor substrate. FIG. 2 is a cross-sectional view of a semiconductor device according to an embodiment of the inventive concept. FIG. 3 is an enlarged view of the region M of FIG. 2. Hereinafter, an embodiment of a semiconductor device according to the inventive concept will be described in detail with reference to FIGS. 1 to 3.

A semiconductor device 10 according to an embodiment of the inventive concept may include a semiconductor substrate WF, a first insulating layer IL1 on the semiconductor substrate WF, a channel layer CHL on the first insulating layer ILL a silicide SI arranged on two sides of the channel layer CHL, a gate insulating film GI on the channel layer CHL, a control gate CG on the gate insulating film GI, polarity control gates PG on the gate insulating film GI, and metal lines ML. The semiconductor device 10 may include a reconfigurable field effect transistor.

The semiconductor substrate WF may include silicon, germanium, and/or silicon-germanium. The semiconductor substrate WF may include monocrystalline silicon and/or polycrystalline silicon. The semiconductor substrate WF may include monocrystalline germanium and/or polycrystalline germanium. The semiconductor substrate WF may include a bulk wafer or may be formed by dicing a bulk wafer. For example, the semiconductor device 10 may be formed on an amorphous silicon oxide film wafer.

The first insulating layer IL1 may be provided on the semiconductor substrate WF. The first insulating layer IL1 may include a local region SR and a hole H. The first insulating layer IL1 may include a silicon nitride film, silicon oxide film, silicon oxynitride film, or metal oxide.

In the first insulating layer ILL the local region SR may be a region in which a portion of an upper surface of the first insulating layer IL1 is recessed. Therefore, a level of an inside of the local region SR of the first insulating layer IL1 may be lower than a level of an outside of the local region SR. The hole H may be spaced apart from the local region SR and may completely penetrate the first insulating layer IL1. The hole H may be filled with monocrystalline or polycrystalline silicon.

Figure 18:
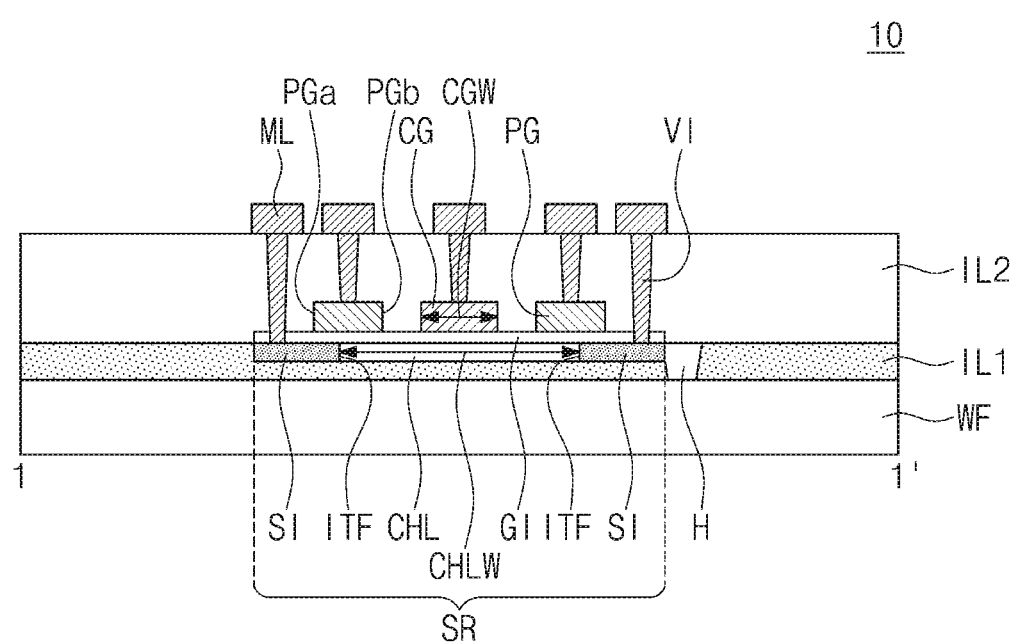
FIG. 18 is a cross-sectional view of a semiconductor device according to an embodiment of the inventive step.

In an embodiment of the inventive concept, the local region SR and the hole H may be arranged spaced apart from each other. Alternatively, in an embodiment of the inventive concept, the local region SR and the hole H may be arranged contiguous to each other (see FIG. 18). The hole H may be arranged at an edge of the local region SR.

The channel layer CHL may be provided in the local region SR. The channel layer CHL may include a monocrystalline silicon layer or monocrystalline germanium layer. The channel layer CHL may include a monocrystalline silicon layer or monocrystalline germanium layer having unidirectional crystallinity. As described below, the channel layer CHL may be formed by performing an epitaxial lateral growth process. A level of an upper surface of the channel layer CHL may be the same as a level of the upper surface of the first insulating layer IL1.

The silicide SI may be provided on two sides of the channel layer CHL of the local region SR. The silicide SI may include any one of $TiSi_2$, $CoSi_2$, NiSi, $NiSi_2$, $WSi_2$, $MoSi_2$, and $TaSi_2$. One side of the silicide SI may be directly connected to one side of the channel layer CHL. An interface ITF may be defined, in which one side of the silicide SI and one side of the channel layer CHL are directly connected to each other. A level of an upper surface of the silicide SI may be the same as the level of the upper surface of the channel layer CHL.

The gate insulating film GI may be provided on the channel layer CHL. The gate insulating film GI may be commonly provided on the silicide SI and the channel layer CHL or may be provided only on the channel layer CHL. The gate insulating film GI may include a silicon nitride film, silicon oxide film, silicon oxynitride film, or metal oxide.

The control gate CG and the polarity control gates PG may be provided on the gate insulating film GI. The control gate CG may be provided on the channel layer CHL. The control gate CG may be arranged between and spaced apart from the polarity control gates PG. A width CHLW of the channel layer CHL may be larger than a width CGW of the control gate CG. The control gate CG may vertically overlap at least a portion of the channel layer CHL. The control gate CG and the polarity control gates PG may include at least one of a doped semiconductor material (doped silicon, doped germanium, etc.), conductive metal nitride (e.g., titanium nitride or tantalum nitride), and metal material (e.g., titanium, tantalum, tungsten, copper, or aluminum).

Referring to FIG. 3, the polarity control gates PG may be commonly provided on the channel layer CHL and the silicide SI. A first side surface PGa of the polarity control gates PG may be provided on the silicide SI and a second side surface PGb opposite to the first side surface PGa may be provided on the channel layer CHL. The polarity control gates PG may be provided on the interface ITF between the channel layer CHL and the silicide SI. Each of the polarity control gates PG may be provided so as to vertically overlap the interface ITF between the channel layer CHL and the silicide SI.

Different voltages may be applied to the control gate CG and the polarity control gates PG. The polarity control gates PG may control a polarity of the semiconductor device 10. For example, when a positive voltage is applied to the polarity control gates PG, the semiconductor device 10 may function as an N-type field effect transistor. That is, when a positive voltage is applied to each of the control gate CG and the polarity control gates PG, electrons may move as carriers through the channel layer CHL of the semiconductor device 10. For another example, when a negative voltage is applied to the polarity control gates PG, the semiconductor device 10 may function as a P-type field effect transistor. That is, when a negative voltage is applied to each of the control gate CG and the polarity control gates PG, holes may move as carriers through the channel layer CHL. The semiconductor device 10 may operate as a P-type or N-type field effect transistor by adjusting a voltage applied to the polarity control gates PG.

A second insulating layer IL2 may be provided on the first insulating layer IL1. The second insulating layer IL2 may cover the gate insulating film GI, the control gate CG, and the polarity control gates PG. The second insulating layer IL2 may include a silicon nitride film, silicon oxide film, or silicon oxynitride film.

The second insulating layer IL2 may include conductive vias VI therein. A portion of the conductive vias VI may penetrate the second insulating layer IL2 and the gate insulating film GI and may be connected to the silicide SI. Another portion of the conductive vias VI may penetrate the second insulating layer IL2 and may be connected to the control gate CG and the polarity control gates PG.

The metal lines ML may be provided on the second insulating layer IL2. Each of the metal lines ML may be electrically connected to the control gate CG, the polarity control gates PG, or the silicide SI through the conductive via VI. The conductive vias VI and the metal lines ML may include any one of titanium, tantalum, tungsten, copper, and aluminum.

FIGS. 4 to 12 are diagrams illustrating a method for manufacturing a semiconductor device. FIGS. 4 to 12 are diagrams corresponding to cross sections taken along line 1-1' on the semiconductor substrate of FIG. 1. Hereinafter, an embodiment of the method for manufacturing a semiconductor device will be described in detail with reference to FIGS. 2 and 4 to 12.

Figure 4:
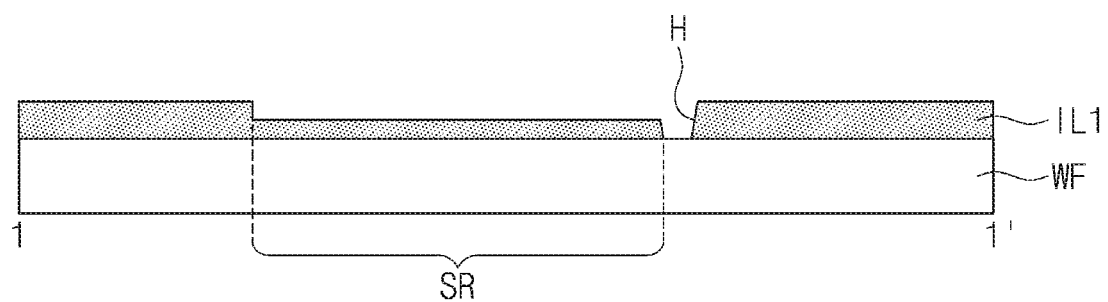
FIGS. 4 to 12 are diagrams illustrating a method for manufacturing a semiconductor device.

Referring to FIG. 4, the first insulating layer IL1 may be formed on the semiconductor substrate WF. The semiconductor substrate WF may include monocrystalline silicon or polycrystalline silicon. The first insulating layer IL1 may include a silicon nitride film, silicon oxide film, silicon oxynitride film, or metal oxide.

The local region SR may be defined on the first insulating layer IL'. The local region SR may be a partially recessed region in the first insulating layer IL1. The hole H, which completely penetrates a portion of the first insulating layer IL1 may be formed. A portion of an upper surface of the semiconductor substrate WF may be externally exposed through the hole H. For example, the hole H may be arranged contiguous to the local region SR. For another example, the hole H may be arranged spaced apart from the local region SR unlike the illustration.

Forming the local region SR may include performing a process of etching a portion of the first insulating layer IL1 by using an etching mask in which a local region pattern is formed (not shown). Forming the hole H may include performing a process of etching to penetrate the first insulating layer IL1 by using an etching mask in which a hole pattern is formed (not shown).

Figure 5:
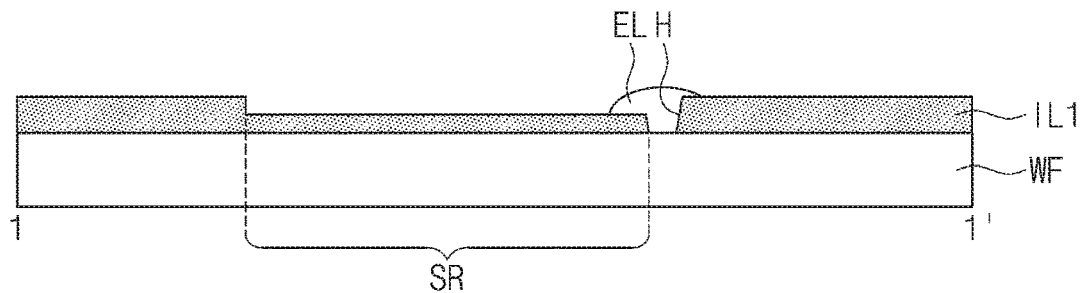

Referring to FIG. 5, an epi layer EL may be formed on an upper surface of the semiconductor substrate WF exposed externally through the hole H. Forming the epi layer EL may include growing the epi layer EL using the upper surface of the semiconductor substrate WF as a seed. The epi layer EL may be isotropically formed. Namely, the epi layer EL may be grown in the hole H in a vertical direction to the upper surface of the semiconductor substrate WF.

Forming the epi layer EL may include forming a monocrystalline silicon layer on the semiconductor substrate WF in the hole H. Therefore, the epi layer EL may include monocrystalline silicon. The epi layer EL may be gradually formed and may protrude out of a surface of the first insulating layer IL1'.

Figure 6:
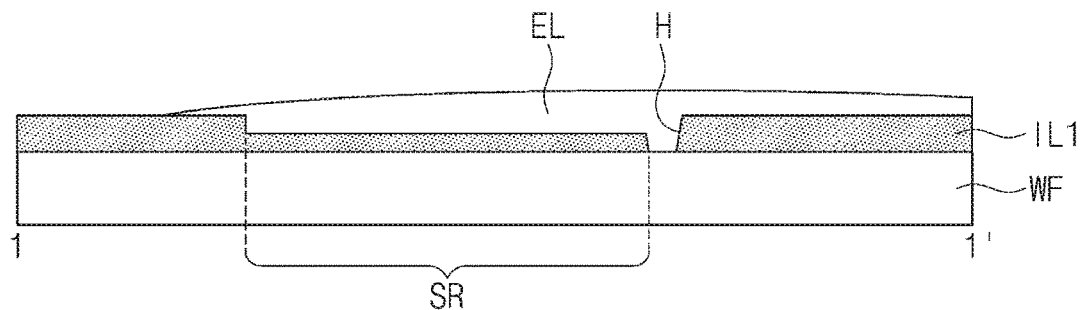

Referring to FIG. 6, the epi layer EL protruding out of the surface of the first insulating layer IL1 may be horizontally formed on the first insulating layer IL1. Namely, an epitaxial lateral growth process may be performed on the first insulating layer IL1. The epi layer EL may be formed in the local region SR of the first insulating layer IL1 through the epitaxial lateral growth process. The epi layer EL may completely fill an inside of the local region SR.

Figure 7:
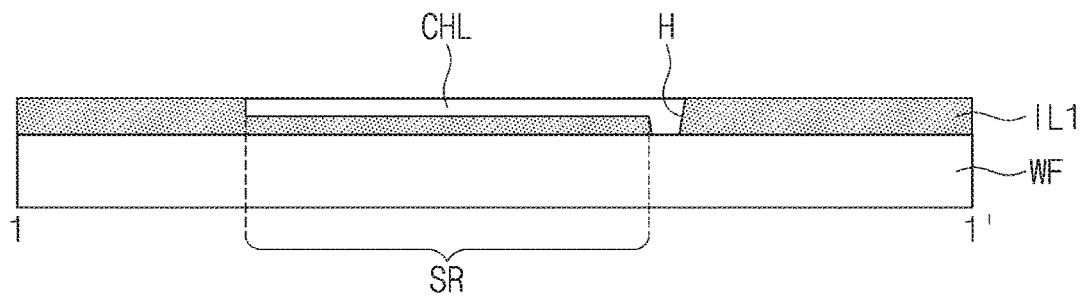

Referring to FIG. 7, a planarization process may be performed after the epi layer EL is formed in the local region SR. The planarization process may be performed until a level of an upper surface of the epi layer EL becomes equal to the level of the upper surface of the first insulating layer IL1. The epi layer EL remaining in the local region SR may form the channel layer CHL through the planarization process.

Figure 8:
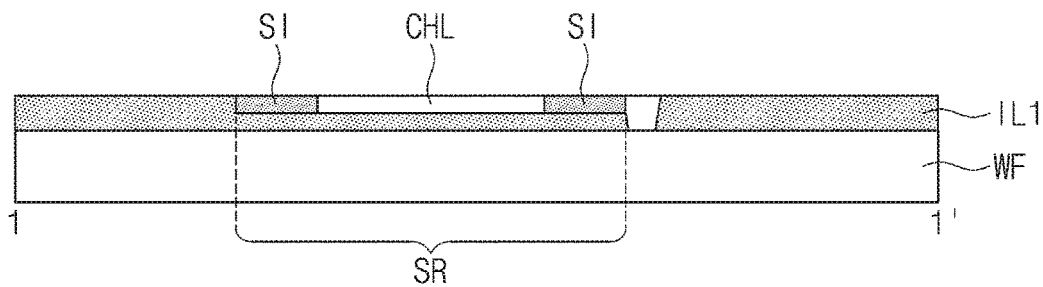

Referring to FIG. 8, the silicide SI may be formed at edges on two sides of the channel layer CHL formed in the local region SR. Forming the silicide SI may include performing a process of chemically and/or thermally reacting Ti or Co with silicon of the channel layer CHL.

Figure 9:
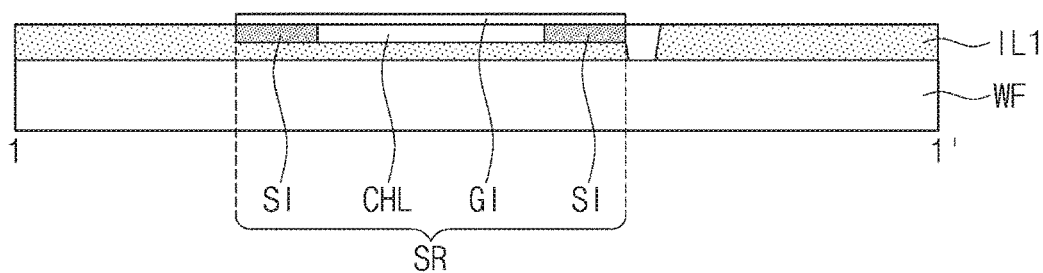

Referring to FIG. 9, the gate insulating film GI may be formed on the channel layer CHL and the silicide SI. The gate insulating film GI and the first insulating layer IL1 may have different etch selectivities. The gate insulating film GI may include a silicon nitride film, silicon oxide film, silicon oxynitride film, or metal oxide.

Figure 10:
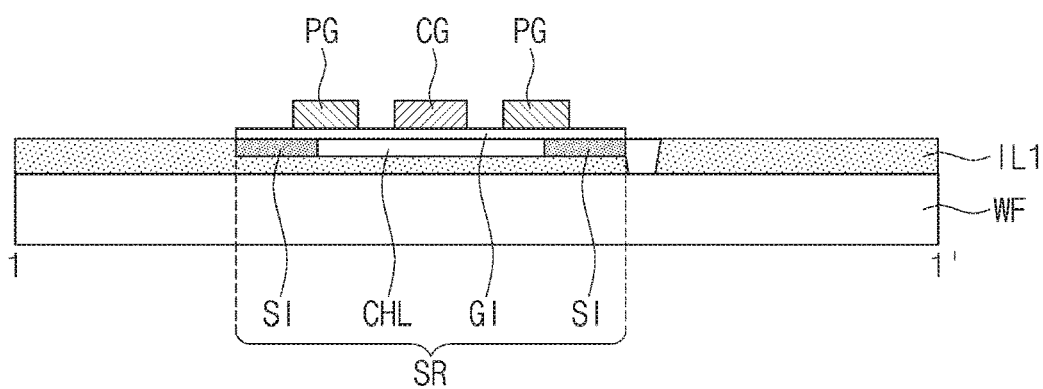

Referring to FIG. 10, the control gate CG and the polarity control gates PG may be formed on the gate insulating film GI. The polarity control gates PG may be formed so as to vertically overlap the interface ITF between the silicide SI and the channel layer CHL. Namely, the polarity control gates PG may be formed so as to vertically overlap two sides of the channel layer CHL respectively. The control gate CG may be formed between the polarity control gates PG. The control gate CG may be formed spaced apart from the polarity control gates PG.

Figure 11:
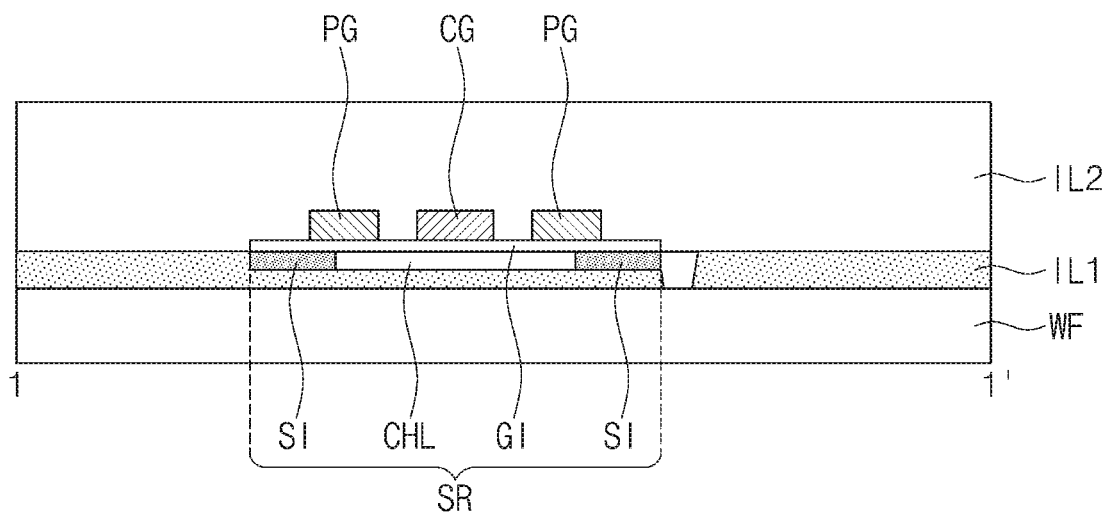

Referring to FIG. 11, the second insulating layer IL2 may be formed on the first insulating layer IL1. The second insulating layer IL2 may include a silicon nitride film, silicon oxide film, or silicon oxynitride film. The second insulating layer IL2 may cover the gate insulating film GI, the control gate CG, and the polarity control gates PG.

Figure 12:
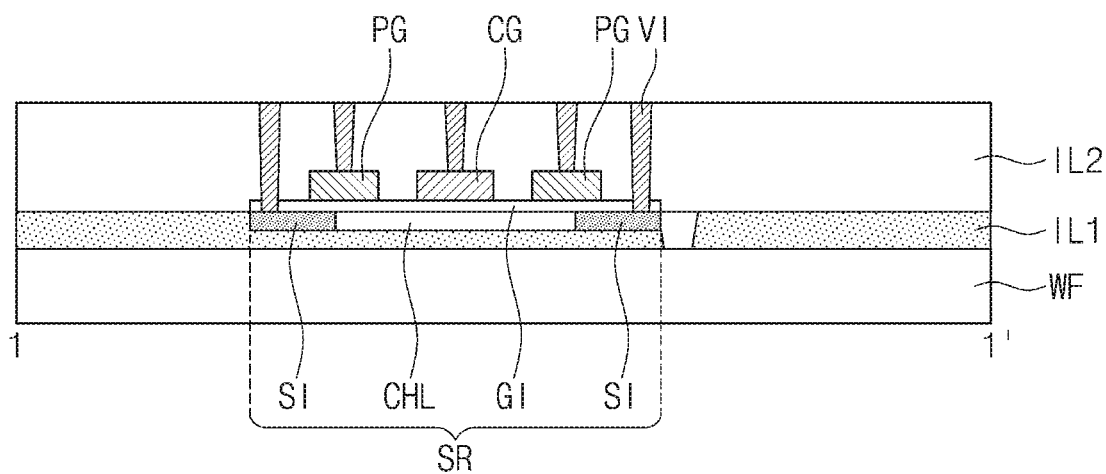

Referring to FIG. 12, the conductive vias VI may be formed in the second insulating layer IL2. Forming the conductive vias VI in the second insulating layer IL2 may include forming vias penetrating the second insulating layer IL2 and exposing upper surfaces of the silicide SI, the control gate CG, and the polarity control gates PG, and forming conductive materials in the vias. The conductive vias VI may include any one of titanium, tantalum, tungsten, copper, and aluminum.

Referring back to FIG. 2, the metal lines ML may be formed on the conductive vias VI. The metal lines ML may be electrically connected to the silicide SI, the control gate CG, or the polarity control gates PG through the conductive vias VI.

Figure 13:
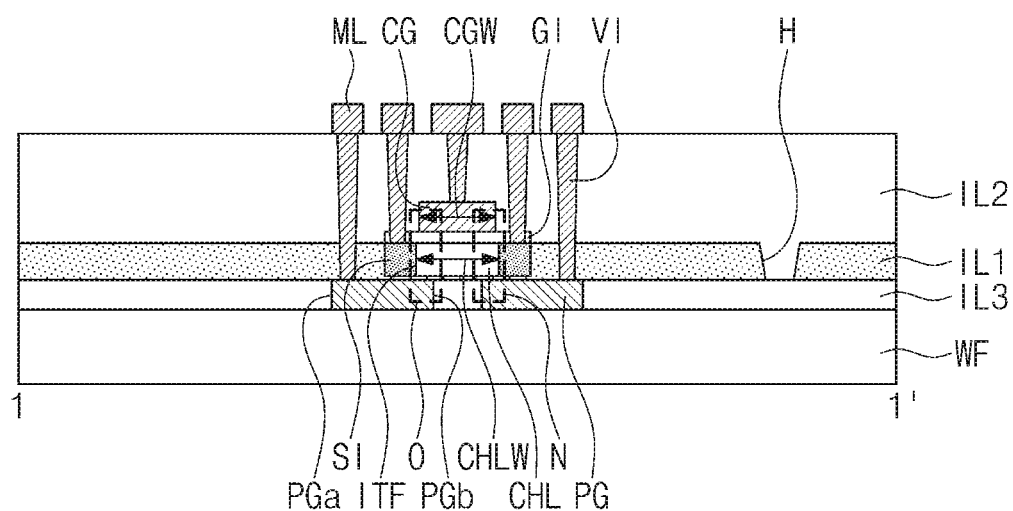
FIG. 13 is a diagram illustrating an embodiment of a semiconductor device of the inventive concept.
Figure 14:
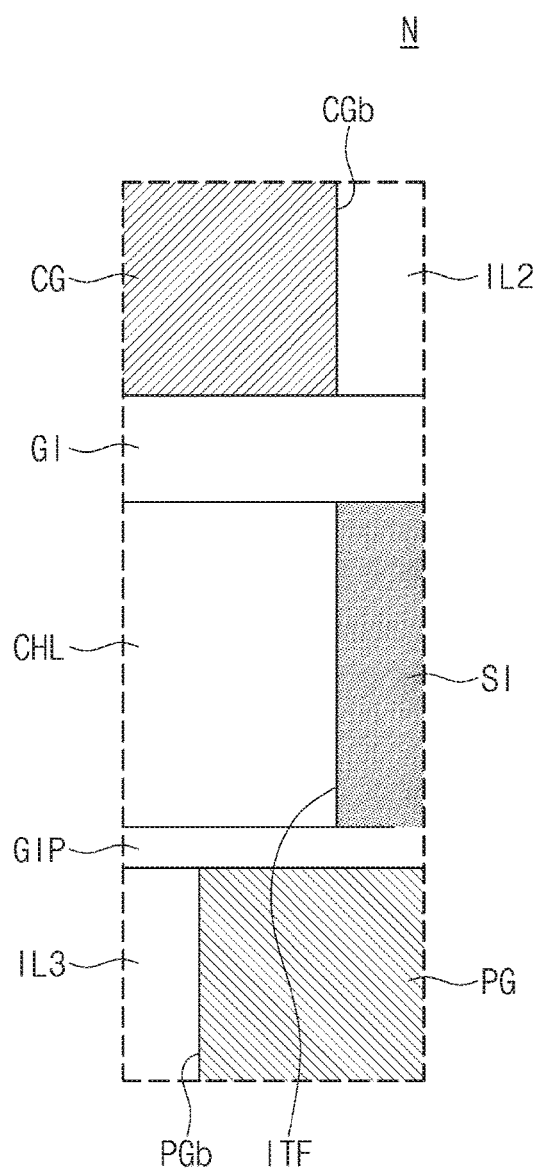
FIG. 14 is an enlarged view of the region N of FIG. 13.
Figure 15:
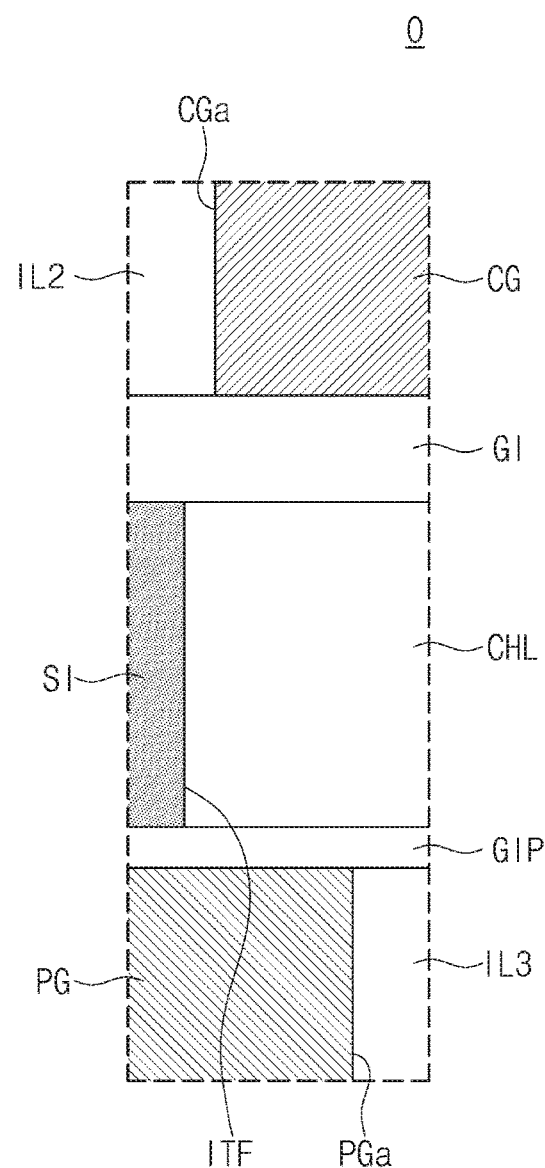
FIG. 15 is an enlarged view of the region O of FIG. 13.

FIG. 13 is a diagram illustrating an embodiment of a semiconductor device. FIG. 14 is an enlarged view of the region N of FIG. 13. FIG. 15 is an enlarged view of the region O of FIG. 13. The following descriptions are focused on differences between the semiconductor device of FIG. 13 and the above-described semiconductor device, and substantially the same descriptions as provided above with reference to FIGS. 1 to 3 are not provided below.

Referring to FIG. 13, an embodiment of the semiconductor device 10 may further include a third insulating layer IL3 between the semiconductor substrate WF and the first insulating layer IL1. The channel layer CHL, the silicide SI, the gate insulating film GI, and the control gate CG may be provided on the third insulating layer IL3.

The polarity control gates PG may be provided in the third insulating layer IL3. The polarity control gates PG may be provided so as to vertically overlap the interface ITF between the channel layer CHL and the silicide SI (see FIGS. 14 and 15). Namely, the one side surface PGb of the polarity control gate PG may be arranged inside the channel layer CHL so as to overlap the channel layer CHL.

The control gate CG may be provided on the channel layer CHL. One side surface CGb of the control gate CG may be arranged in alignment with the interface ITF between the silicide SI and the channel layer CHL (see FIG. 14). Another side surface CGa of the control gate CG may be arranged inside the channel layer CHL so as to overlap the channel layer CHL (see FIG. 15).

The width CGW of the control gate CG may be substantially the same as or smaller than the width CHLW of the channel layer CHL. In the case where the two side surfaces CGa and CGb of the control gate CG overlap the interface ITF between the silicide SI and the channel layer CHL, the width CHLW of the channel layer CHL may be the same as the width CGW of the control gate CG. In the case where at least one side surface CGa among the two side surfaces of the control gate CG is arranged inside the channel layer CHL, the width CGW of the control gate CG may be smaller than the width CHLW of the channel layer CHL. The width CHLW of the channel layer CHL of the embodiment of the semiconductor device 10 of FIG. 13 may be smaller than the width CHLW of the channel layer CHL of the embodiment of the semiconductor device 10 of FIG. 2.

Figure 16:
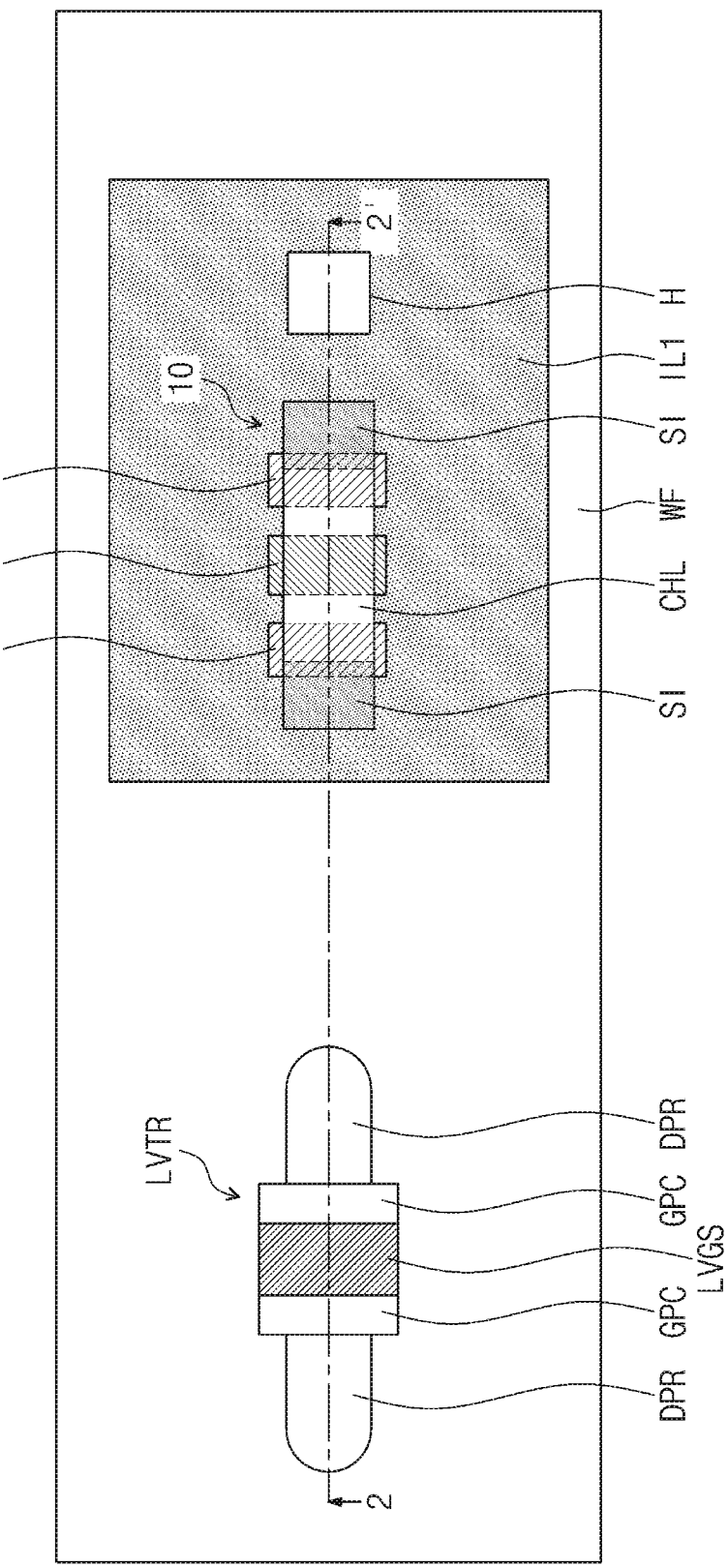
FIGS. 16 and 17 are diagrams illustrating application examples of a semiconductor device according to an embodiment of the inventive concept.
Figure 17:
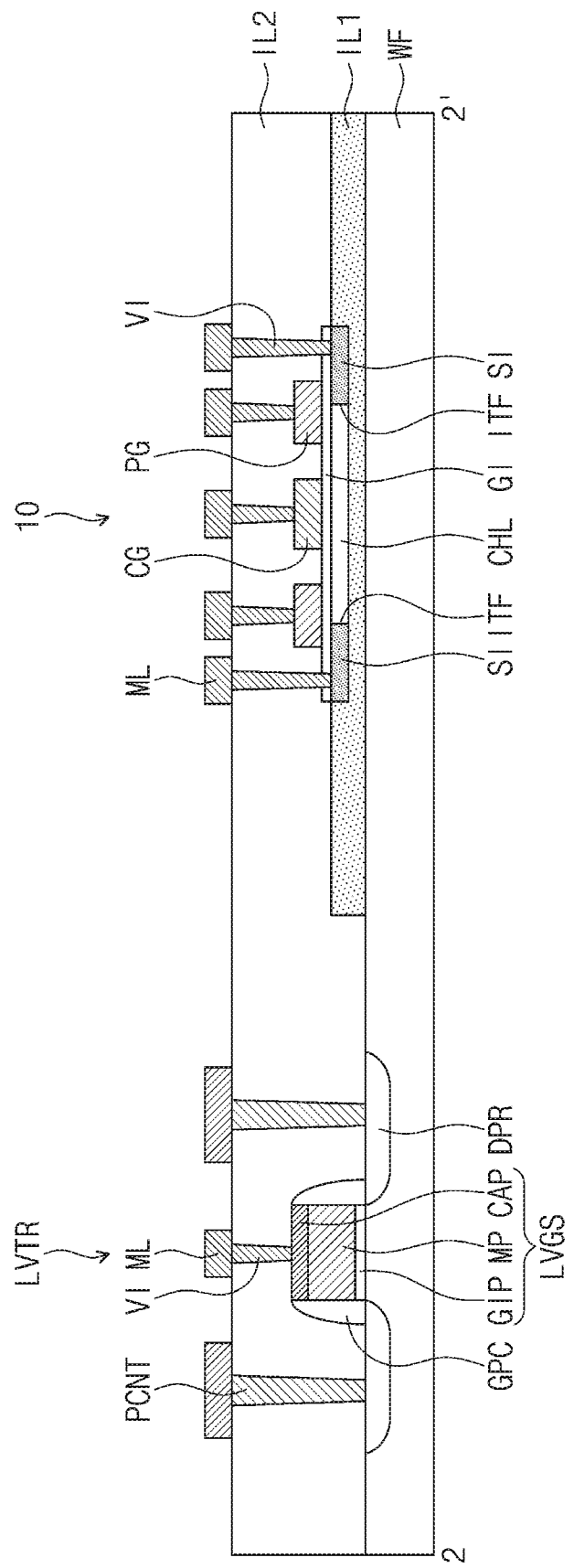

FIGS. 16 and 17 are diagrams illustrating application examples of a semiconductor device. Hereinafter, an application example of the inventive concept will be described in detail.

The semiconductor device 10 may be provided in an arbitrary region on the semiconductor substrate WF. The semiconductor substrate WF may include a silicon semiconductor substrate WF. A peripheral transistor LVTR may be arranged spaced apart from the semiconductor device 10 on the semiconductor substrate WF.

The peripheral transistor LVTR may include a gate structure LVGS. The gate structure LVGS may include a gate insulating pattern GIP, a metal pattern MP, and a capping pattern CAP, which are sequentially laminated. For example, the gate insulating pattern GIP may include a silicon oxide film. For another example, the gate insulating pattern GIP may include a first insulating film (e.g., silicon oxide film) and a second insulating film (e.g., silicon oxynitride film), which are sequentially laminated. The metal pattern MP may include at least one metal selected from the group consisting of titanium, tantalum, tungsten, copper, and aluminum. The capping pattern CAP may include a silicon oxide film, a silicon nitride film, and/or a silicon oxynitride film.

A pair of gate spacers GPC may be provided on two sidewalls of the gate structure LVGS respectively. A peripheral contact PCNT may contact an impurity region DPR adjacent to the gate structure LVGS. The impurity region DPR may be provided on the semiconductor substrate WF and may include an polycrystalline silicon film doped with impurities and having an N type or P type.

The semiconductor device 10 may be formed using the same processes as those for forming the peripheral transistor LVTR. Therefore, the peripheral transistor LVTR and the semiconductor device 10 may be simultaneously formed in arbitrary regions on the semiconductor substrate WF.

A semiconductor device according to an embodiment of the inventive concept provides a reconfigurable field effect transistor capable of being formed in an arbitrary region on an amorphous semiconductor substrate using the same process as that for a typical CMOS field effect transistor.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A semiconductor device comprising:
    a semiconductor substrate including monocrystalline silicon or polycrystalline silicon;
    a first insulating layer on the semiconductor substrate, the first insulating layer including a local region in which a portion of an upper surface of the first insulating layer is recessed;
    a channel layer provided in the local region of the first insulating layer;
    a silicide provided on one side surface of the channel layer;
    a control gate provided on the channel layer;
    a gate insulating film provided between the channel layer and the control gate; and
    a polarity control gate arranged so as to overlap an interface between the channel layer and the silicide, wherein the polarity control gate is spaced apart from the control gate, and the channel layer includes monocrystalline silicon.

2. The semiconductor device of claim 1,
    wherein the first insulating layer further includes a hole,
    wherein the hole is arranged spaced apart from the local region.

3. The semiconductor device of claim 1,
    wherein the first insulating layer further includes a hole,
    wherein the hole is contiguous to the local region.

4. The semiconductor device of claim 1,
    wherein the polarity control gate is provided in plurality and includes a first polarity control gate and a second polarity control gate,
    wherein the first polarity control gate overlaps a first side surface of the channel layer, and
    the second polarity control gate overlaps a second side surface of the channel layer.

5. The semiconductor device of claim 1, wherein the channel layer is formed through an epitaxial lateral growth process.

6. The semiconductor device of claim 1, wherein a level of an upper surface of the channel layer is the same as a level of the upper surface of the first insulating layer outside the local region.

7. The semiconductor device of claim 1, wherein the first insulating layer includes a silicon nitride film, silicon oxide film, silicon oxynitride film, or metal oxide.

8. The semiconductor device of claim 1, wherein a width of the control gate is smaller than a width of the channel layer.

9. The semiconductor device of claim 1, wherein the silicide is arranged at an edge of the local region.

* * * * *